United States Patent
Lai et al.

(10) Patent No.: US 9,123,579 B2
(45) Date of Patent: Sep. 1, 2015

(54) 3D MEMORY PROCESS AND STRUCTURES

(71) Applicant: MACRONIX INTERNATIONAL CO., LTD., Hsinchu (TW)

(72) Inventors: Erh-Kun Lai, Longjing Shiang (TW); Chia-Jung Chiu, Zhubei (TW); Chieh Lo, Taipei (TW)

(73) Assignee: MACRONIX INTERNATIONAL CO., LTD. (TW)

( * ) Notice: Subject to any disclaimer, the term of this patent is extended or adjusted under 35 U.S.C. 154(b) by 0 days.

(21) Appl. No.: 13/914,539

(22) Filed: Jun. 10, 2013

(65) Prior Publication Data

US 2014/0264615 A1 Sep. 18, 2014

Related U.S. Application Data

(60) Provisional application No. 61/780,812, filed on Mar. 13, 2013.

(51) Int. Cl.
*H01L 27/115* (2006.01)
*H01L 27/105* (2006.01)

(52) U.S. Cl.
CPC ...... *H01L 27/11582* (2013.01); *H01L 27/1052* (2013.01); *H01L 27/11531* (2013.01); *H01L 27/11548* (2013.01); *H01L 27/11573* (2013.01); *H01L 27/11575* (2013.01); *H01L 27/11556* (2013.01)

(58) Field of Classification Search
None
See application file for complete search history.

(56) References Cited

U.S. PATENT DOCUMENTS

| | | | |
|---|---|---|---|
| 2010/0090188 A1* | 4/2010 | Futatsuyama | 257/2 |
| 2010/0244119 A1* | 9/2010 | Fukuzumi et al. | 257/324 |
| 2012/0061744 A1* | 3/2012 | Hwang et al. | 257/324 |
| 2012/0168831 A1* | 7/2012 | Ahn | 257/288 |
| 2012/0168858 A1* | 7/2012 | Hong | 257/330 |
| 2012/0286345 A1* | 11/2012 | Seo et al. | 257/315 |
| 2013/0126957 A1* | 5/2013 | Higashitani et al. | 257/314 |

FOREIGN PATENT DOCUMENTS

TW 396420 7/2000

* cited by examiner

*Primary Examiner* — Daniel Luke
(74) *Attorney, Agent, or Firm* — Baker & McKenzie LLP

(57) ABSTRACT

A semiconductor device includes a substrate, a stack structure and a transistor. The substrate includes a first region and a second region. The stack structure is formed over the substrate in the first region. The transistor structure has a gate formed in the second region. A bottom portion of the gate structure is disposed at a height from the substrate that is less than a height between the substrate and a bottom portion of the stack structure.

8 Claims, 17 Drawing Sheets

3D MEMORY PROCESS AND STRUCTURES

CROSS-REFERENCE TO RELATED APPLICATIONS

This application claims priority to U.S. Provisional App. Ser. No. 61/780,812, filed Mar. 13, 2013, which is hereby incorporated by reference in its entirety.

BACKGROUND

The present application relates generally to semiconductor devices and includes methods and structures for improving the fabrication of semiconductor devices such as 3D memory structures.

In the fabrication of semiconductor devices, different structures are placed in proximity to each other in the formation of a finished device. For example, a 3D memory structure may include peripheral circuitry and array circuitry. The varying conditions required for the formation of the different structures can cause adverse affects to other structures.

As an example, the array region may be located in a trench provided in a substrate. The formation of such a trench, for example by reactive ion etching, can cause a loading effect that increases process variations and impacts device yield.

As another example, the array region and peripheral region (or varying aspects thereof), may require exposure to significant temperatures for non-negligible periods of time in their formation. This exposure can negatively affect or otherwise cause damage to structures already formed on the device. This concept may be referred to as a thermal budget. Exceeding such a thermal budget for already formed portions of the device can cause damage and impact device yield.

There is a need for improved processes and structures, particularly in the case of 3D memory devices but also for other devices, to reduce the use of process steps that may cause damage to already formed structures and to reduce the likelihood of thermal damage to already formed structures.

BRIEF SUMMARY

In an embodiment, a semiconductor device includes a substrate, a stack structure and a transistor. The substrate includes a first region and a second region. The stack structure is formed over the substrate in the first region. The transistor structure has a gate formed in the second region. A bottom portion of the gate structure is disposed at a height from the substrate that is less than a height between the substrate and a bottom portion of the stack structure.

In another embodiment, a method of fabricating a semiconductor device includes forming a stack structure over a substrate in a first region of the semiconductor device; forming an oxide over the stack structure; and forming at least a portion of a transistor structure in a second region of the semiconductor device after the forming the oxide over the stack structure.

DETAILED DESCRIPTION

Figure 1:
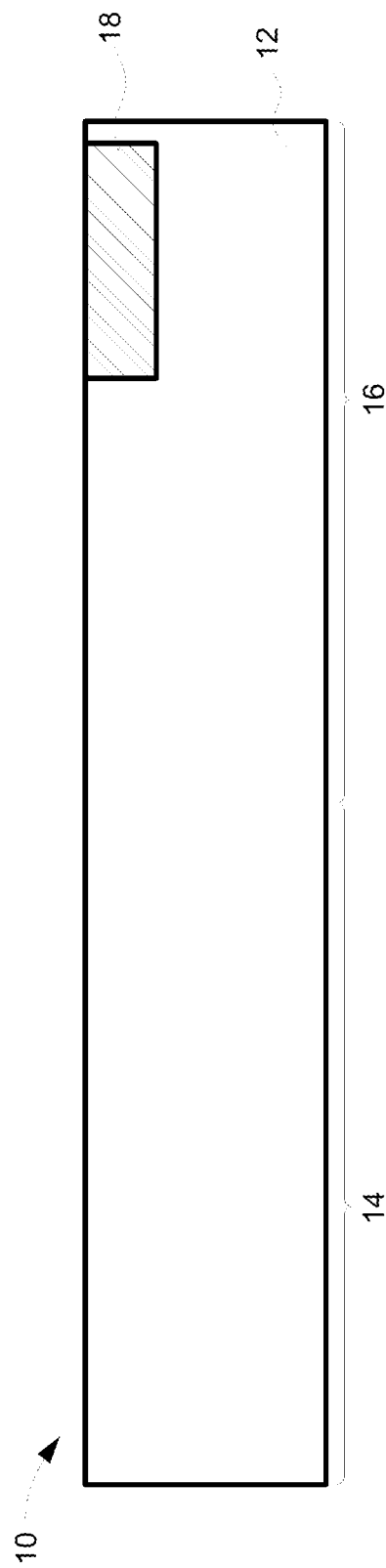
FIG. 1 is a cross-sectional view of an exemplary semiconductor device.

FIG. 1 shows a semiconductor device 10 including a substrate 12. The semiconductor devices may include the array region 14 and the peripheral region 16. The well 18 is formed in the substrate 12. Examples of the well 18 include a deep N well (DNW), for example having a high implant energy, and a high voltage (HV) well.

Figure 2:
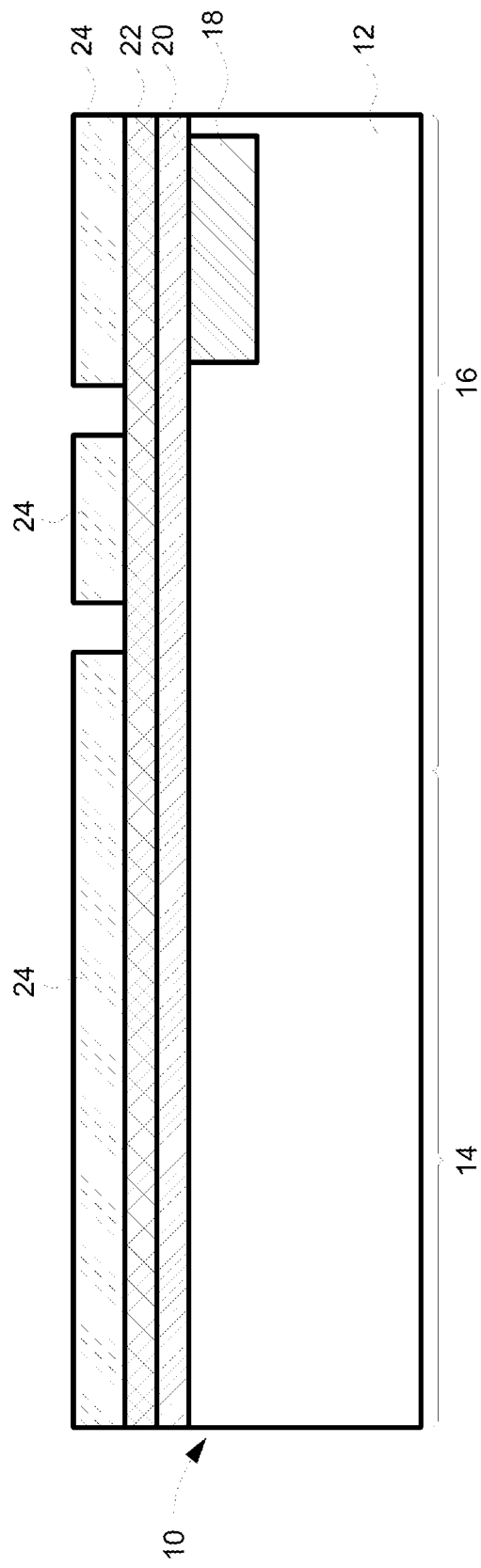
FIG. 2 is a cross-sectional view of an exemplary semiconductor device.

FIG. 2 shows the semiconductor device 10 of FIG. 1 after the formation of the oxide layer 20, the nitride layer 22 and the mask layer 24. The oxide layer 20 may be a pad oxide layer. The nitride layer 22 may be a SiN layer and is provided over the oxide layer. The mask layer 24 may be any type of suitable photo mask. In the example shown, the mask is of the "dark" type where underlying structures are protected and not etched where the mask is present. Other types of masks, such as a Reversed Diffusion Mask (RDF), may also be used. Use of the optional RDF mask can improve CMP uniformity in the unpatterned array region 14. The mask layer 24 is patterned for a subsequent etch to form shallow trench isolation (STI) structures.

Figure 3:
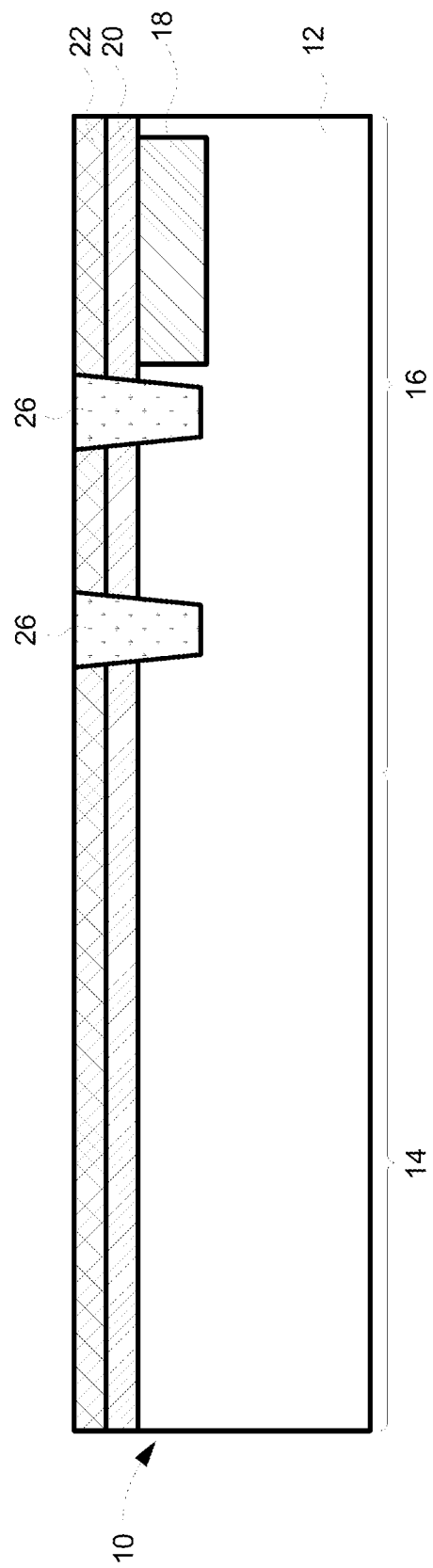
FIG. 3 is a cross-sectional view of an exemplary semiconductor device.

FIG. 3 shows the semiconductor device 10 of FIG. 2 after the formation and fill-in of the STI structures 26. With the mask layer 24 present, an etch, such as a reactive ion etch, is performed to create trench structure. The trench structures are filled in with an oxide, for example using a high density plasma deposition. A chemical mechanical planarization (CMP) that stops on the nitride layer 22 is then performed. The mask layer 24 may be removed in the CMP process or in a separate process.

Figure 4:
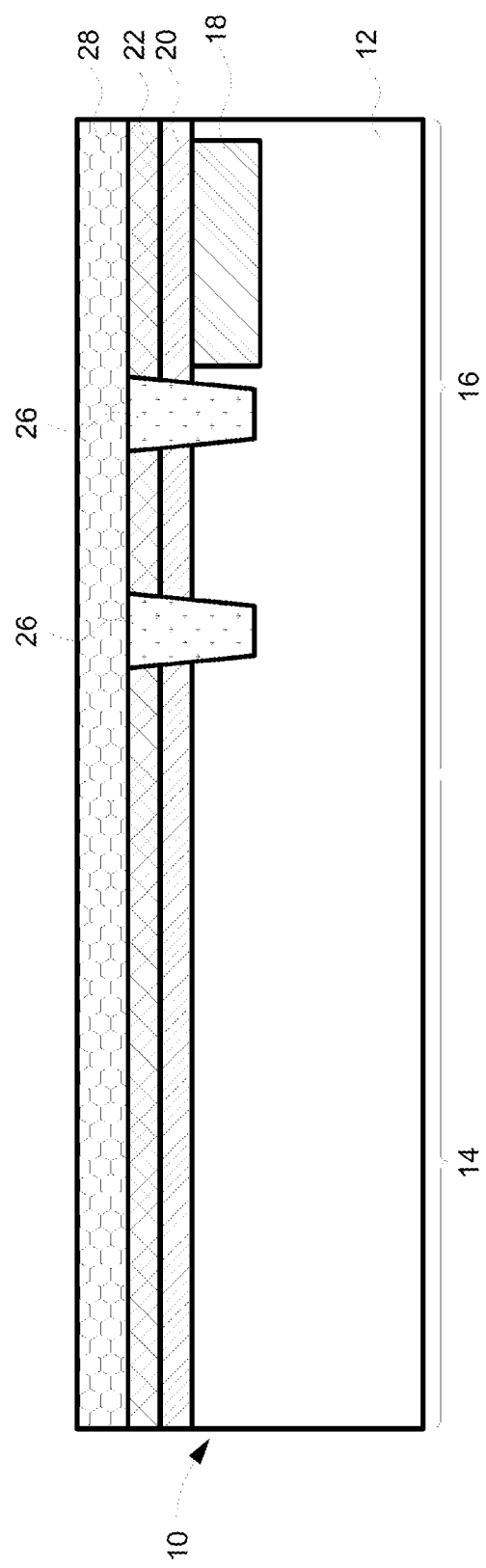
FIG. 4 is a cross-sectional view of an exemplary semiconductor device.

FIG. 4 shows the semiconductor device 10 of FIG. 3 after the formation of the nitride layer 28. The nitride layer 28 provides protection for the structures formed in the peripheral region 16 during subsequent processing steps. The nitride layer 28 may be SiN, for example in a thickness of 1000 angstroms. It will appreciated that the nitride layer 28 is not always required and may be omitted in some embodiments.

Figure 5:
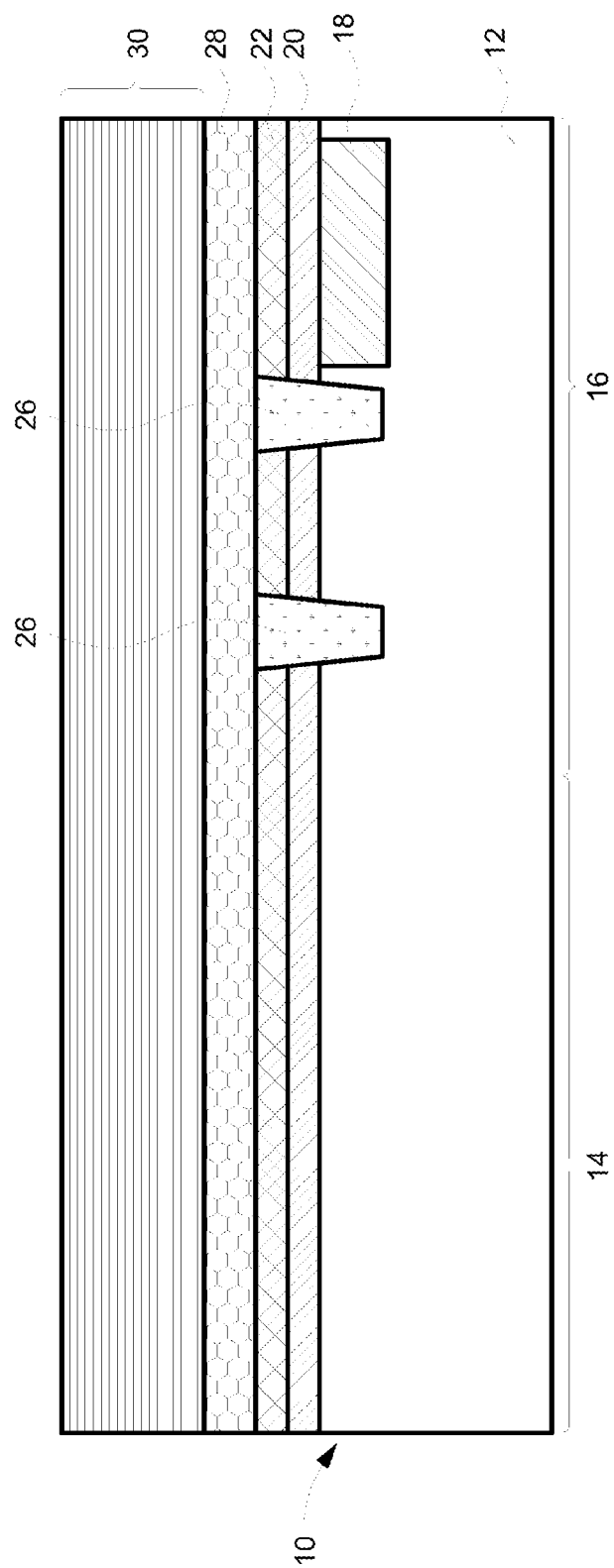
FIG. 5 is a cross-sectional view of an exemplary semiconductor device.
Figure 6:
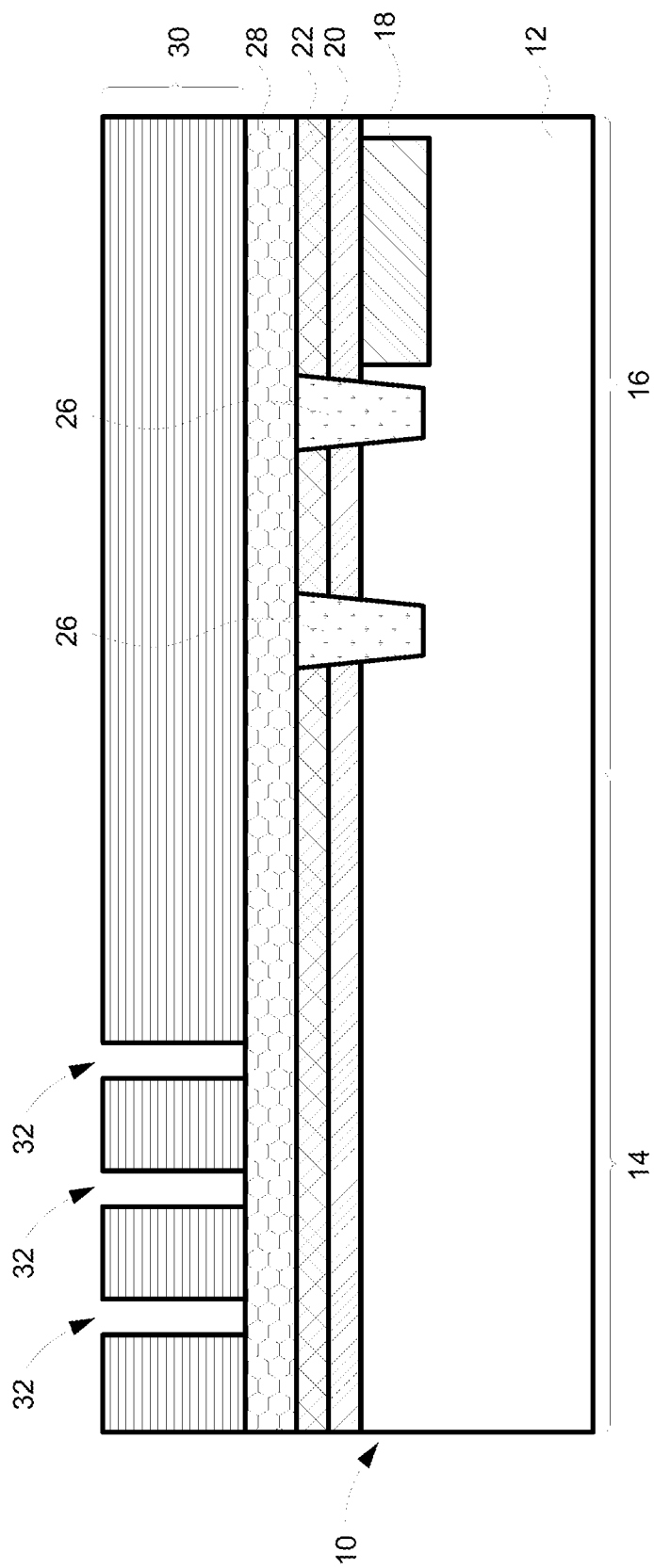
FIG. 6 is a cross-sectional view of an exemplary semiconductor device.

FIG. 5 shows the semiconductor device 10 of FIG. 4 after the formation of the 3D multilayers 30. The 3D multilayers 30 may be oxide/polysilicon multilayers FIG. 6 shows the semiconductor device 10 of FIG. 5 after the formation of the bit line structures 32. The bit line structures 32 may be formed by the formation and patterning of a mask layer followed by an etching process. The mask layer may be a dark type mask layer covering the peripheral region 16 such that the peripheral region 16 is not etched, for example as may be used in a polysilicon layer damascene approach.

Figure 7:
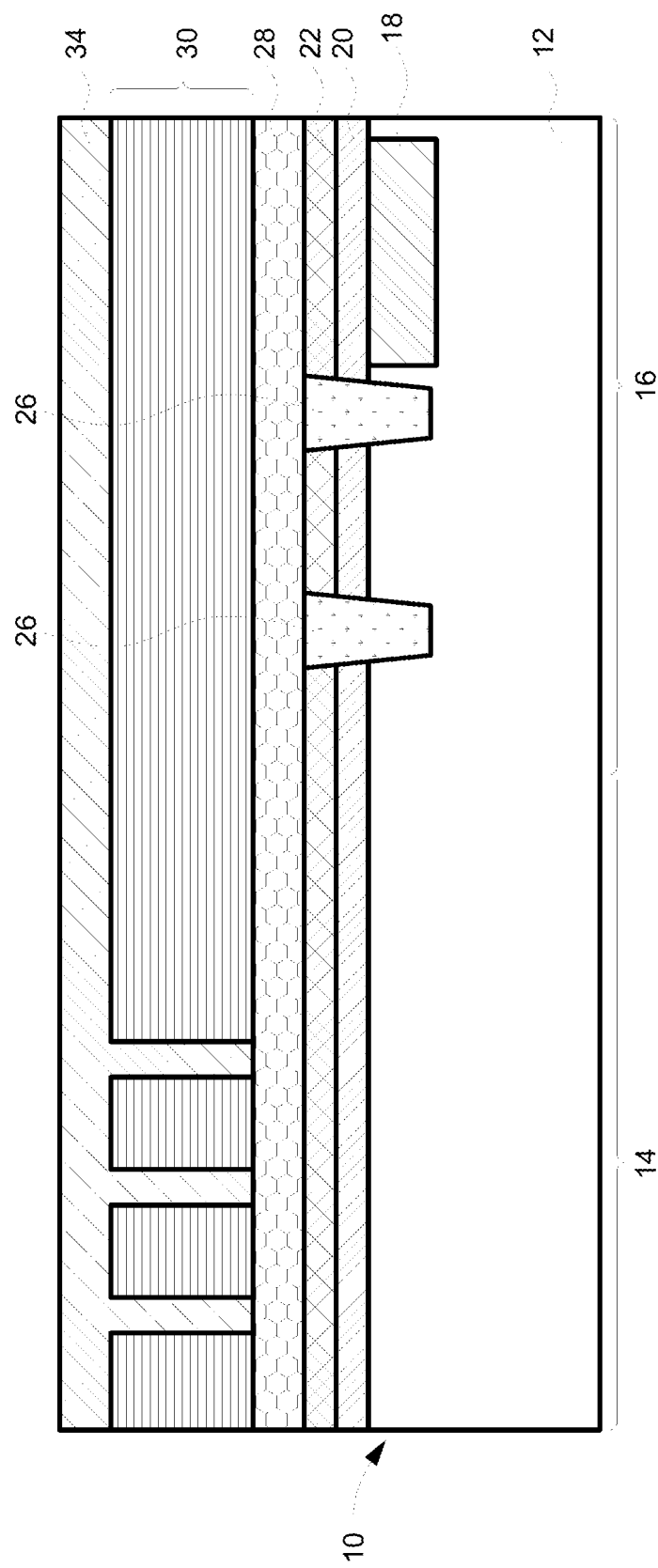
FIG. 7 is a cross-sectional view of an exemplary semiconductor device.

FIG. 7 shows the semiconductor device 10 of FIG. 6 after the formation of the polysilicon layer 34. Before depositing the polysilicon layer 34, the 3D multilayers 30 (e.g., a memory layer including ONO or ONONO) should be formed first. Forming ONO or ONONO structures require a process with a higher thermal budget. For example, temperatures such as 1000 deg C. for a period of approximately 45 minutes may be used to oxidize the film for good reliability. In contrast, formation of the gate oxide 35 may have a smaller thermal budget. For example, temperatures such as 850 deg C. for a period of approximately 20 minutes may be used. Thus, as compared to the oxidation step for a cap oxide, gate oxide has a smaller thermal budget and could be damaged if exposed to the cap oxide formation process. It is preferred that ONO or ONONO layers be formed before a gate oxide layer. The polysilicon layer 34 may be a word line cap and may fill in the bit line structures 32.

Figure 8:
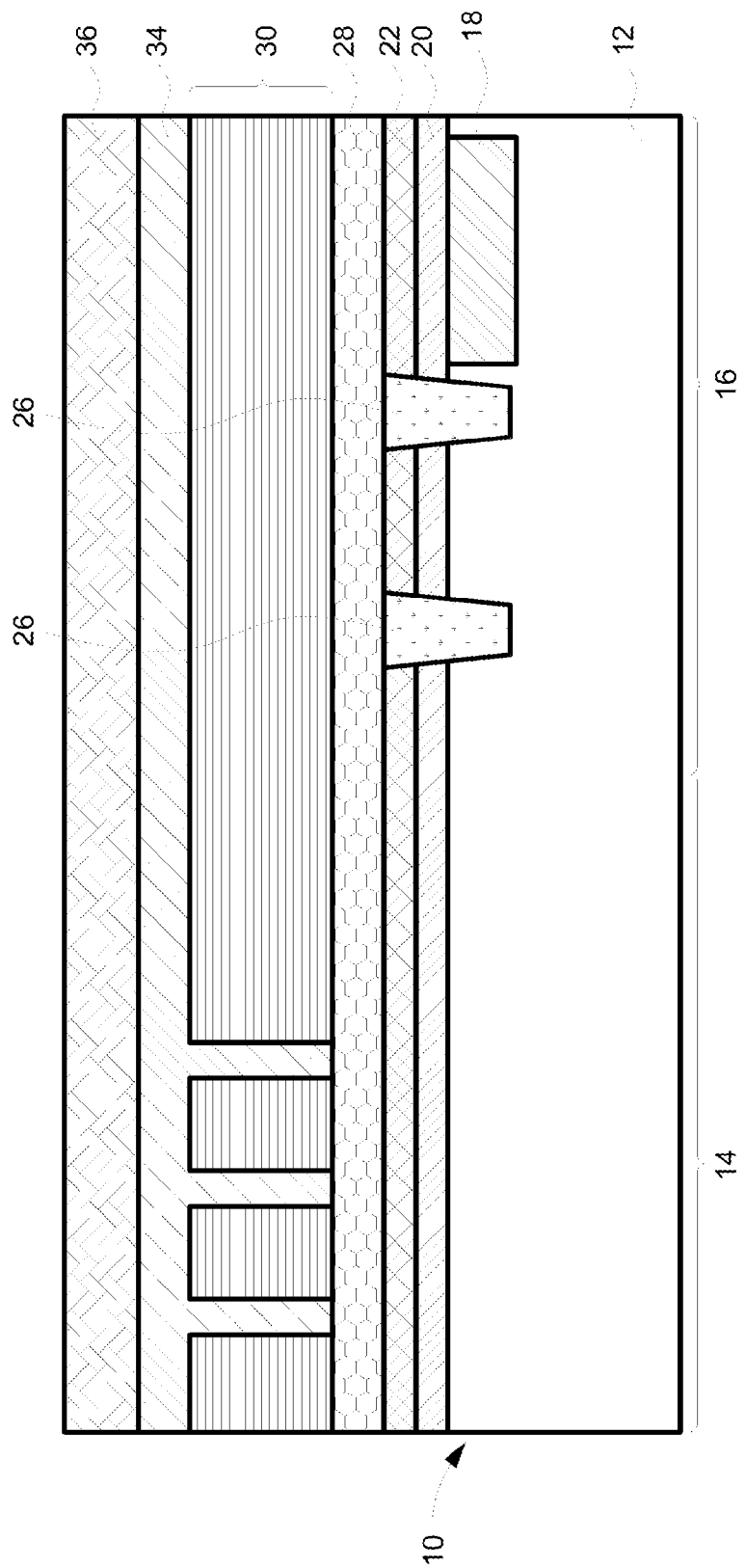
FIG. 8 is a cross-sectional view of an exemplary semiconductor device.

FIG. 8 shows the semiconductor device 10 of FIG. 7 after the formation of the oxide layer 36 over the polysilicon layer 34. The oxide layer 36 may be a cap oxide layer that protects the word lines in the array region 14.

Figure 9:
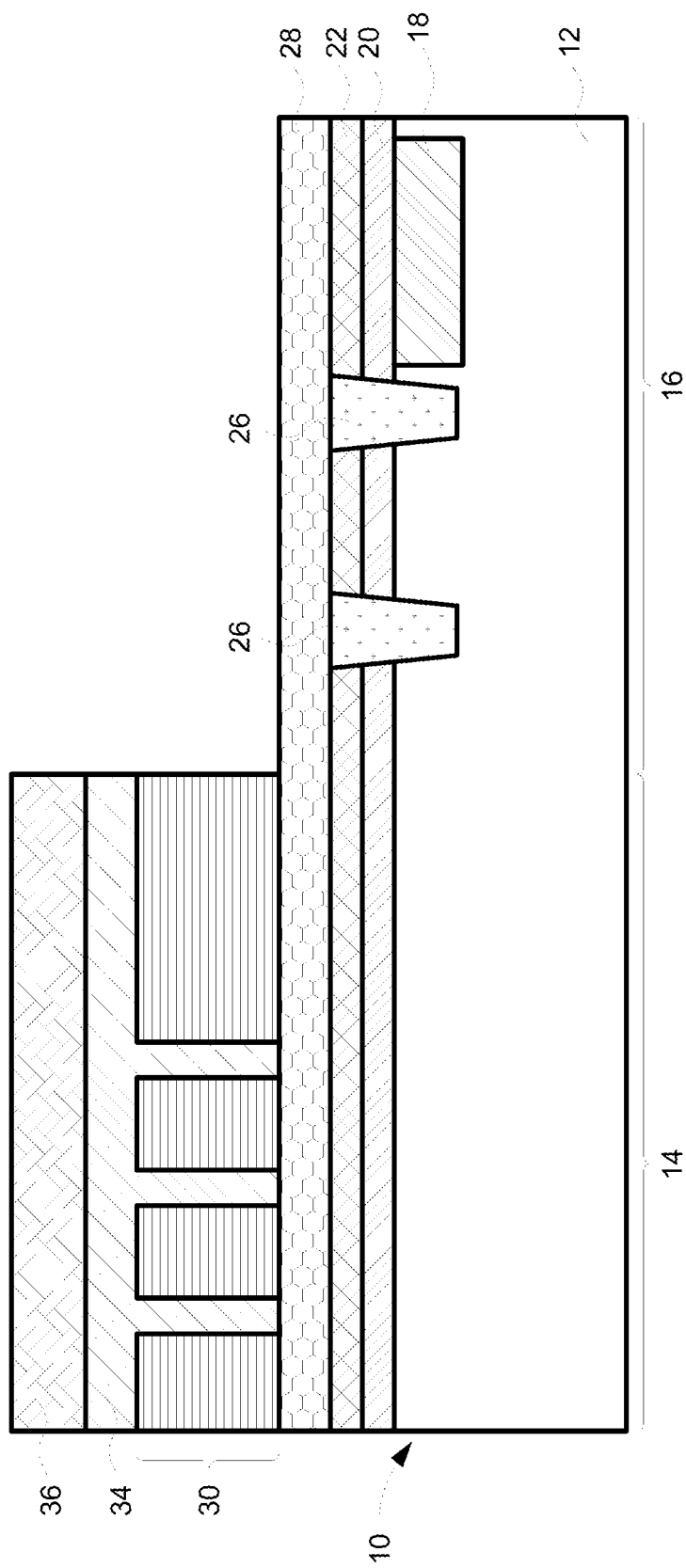
FIG. 9 is a cross-sectional view of an exemplary semiconductor device.

FIG. 9 shows the semiconductor device 10 of FIG. 8 after exposing the nitride layer 28 in the peripheral region 16. The nitride layer 28 in the peripheral region 16 may be exposed by the formation and patterning of a mask layer followed by an etching process. The mask layer may be a dark type mask layer covering the array region 14 such that the array region 14 is not etched.

Figure 10:
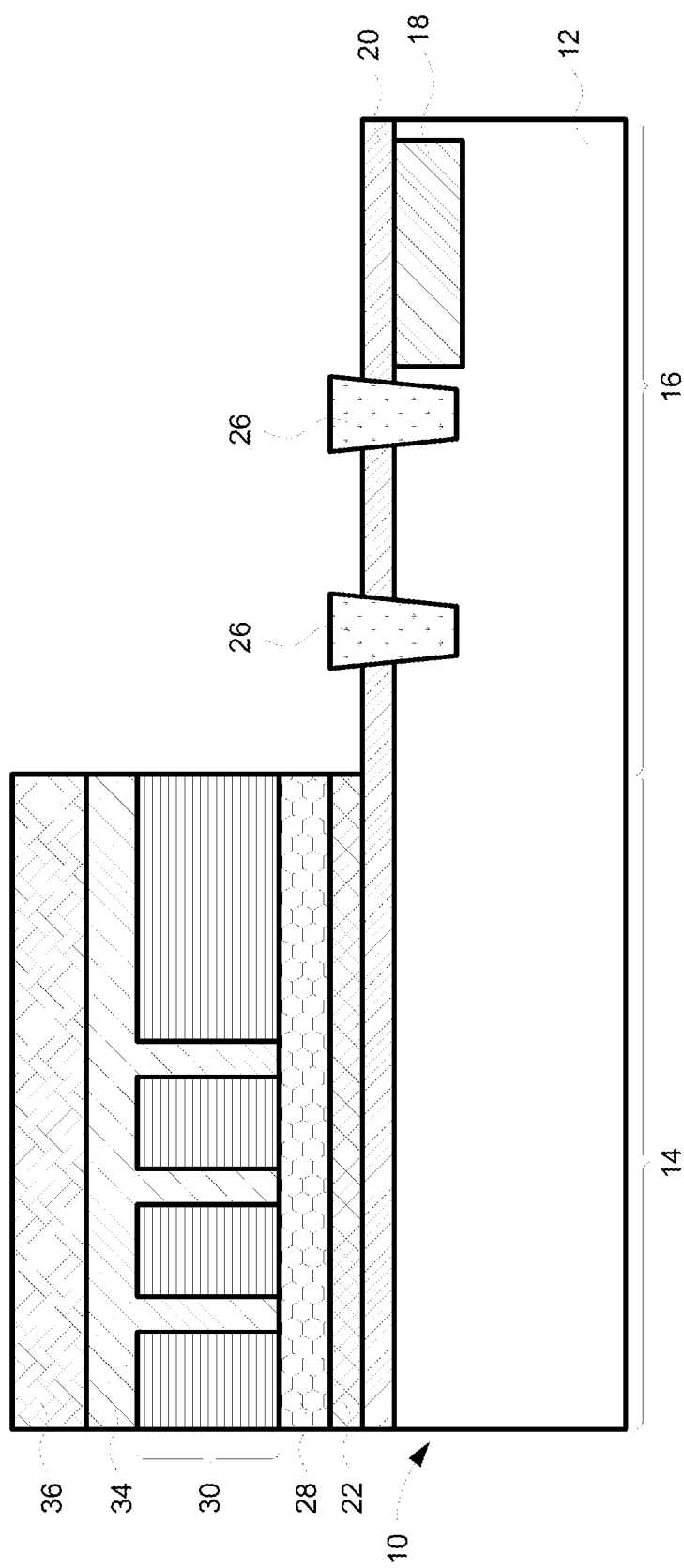
FIG. 10 is a cross-sectional view of an exemplary semiconductor device.

FIG. 10 shows the semiconductor device 10 of FIG. 9 after the portions of the nitride layer 22 and the nitride layer 28 have been removed. The nitride layers 22 and 28 may be removed by exposing the semiconductor device 10 to $H_3PO_4$. The $H_3PO_4$ will remove the exposed nitride in the peripheral region 16 but not in the array region 14 where it is covered by the 3D multilayers 30.

Figure 11:
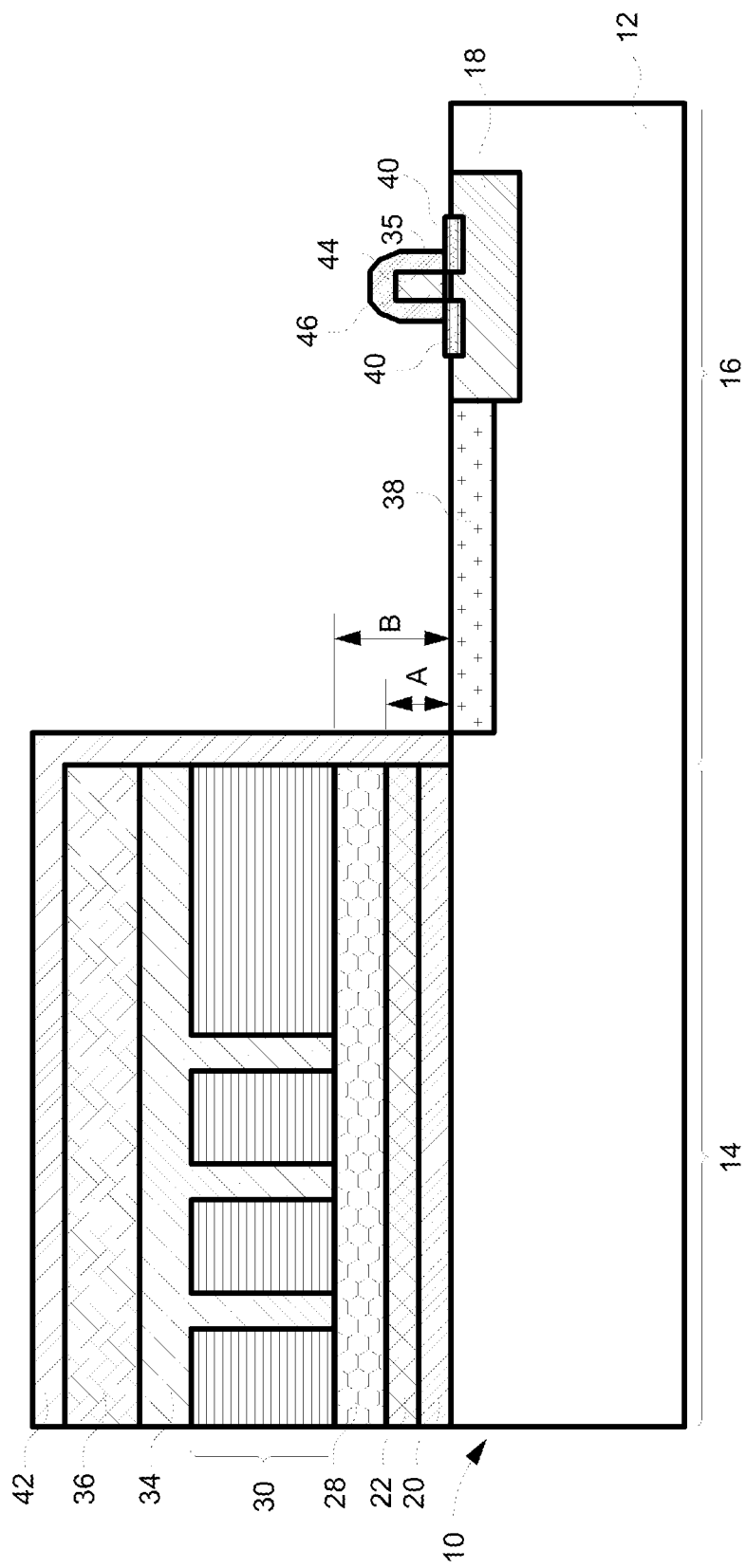
FIG. 11 is a cross-sectional view of an exemplary semiconductor device.

FIG. 11 shows the semiconductor device 10 of FIG. 10 after forming a polysilicon layer and additional structures in the peripheral region 16. The oxide layer 20 is removed in the peripheral region 16 and the low voltage (LV) well 38 and silicide portions 40 are formed in the peripheral region 16. The gate oxide 35 is oxidized after implantation of the LV Well 38 and before the polysilicon layer 42 is formed. The polysilicon layer 42 is formed, for example by deposition, over the semiconductor device 10 including a vertical edge of the array region 14. The polysilicon layer 42 contacts multiple layers of the 3D multilayers 30. In the peripheral region, the polysilicon layer 42 is patterned to form the polysilicon gate 44. The spacer 46 is formed over the polysilicon gate 44. The 3D multilayers 30 are disposed a nonzero distance from the substrate 12.

For example, in embodiments having only the nitride layer 22, the 3D multilayers 30 are disposed a distance A from the substrate 12. The distance A represents the distance approximately from a top of the substrate 12 to a bottom of the 3D multilayers 30 and is approximately equal to a thickness of the oxide layer 20 and the nitride layer 22.

As another example, in embodiments having the nitride layer 22 and the nitride layer 28, the 3D multilayers 30 are disposed a distance B from the substrate 12. The distance B represents the distance approximately from a top of the substrate 12 to a bottom of the 3D multilayers 30 and is approximately equal to a thickness of the oxide layer 20, the nitride layer 22 and the nitride layer 28.

Figure 12:
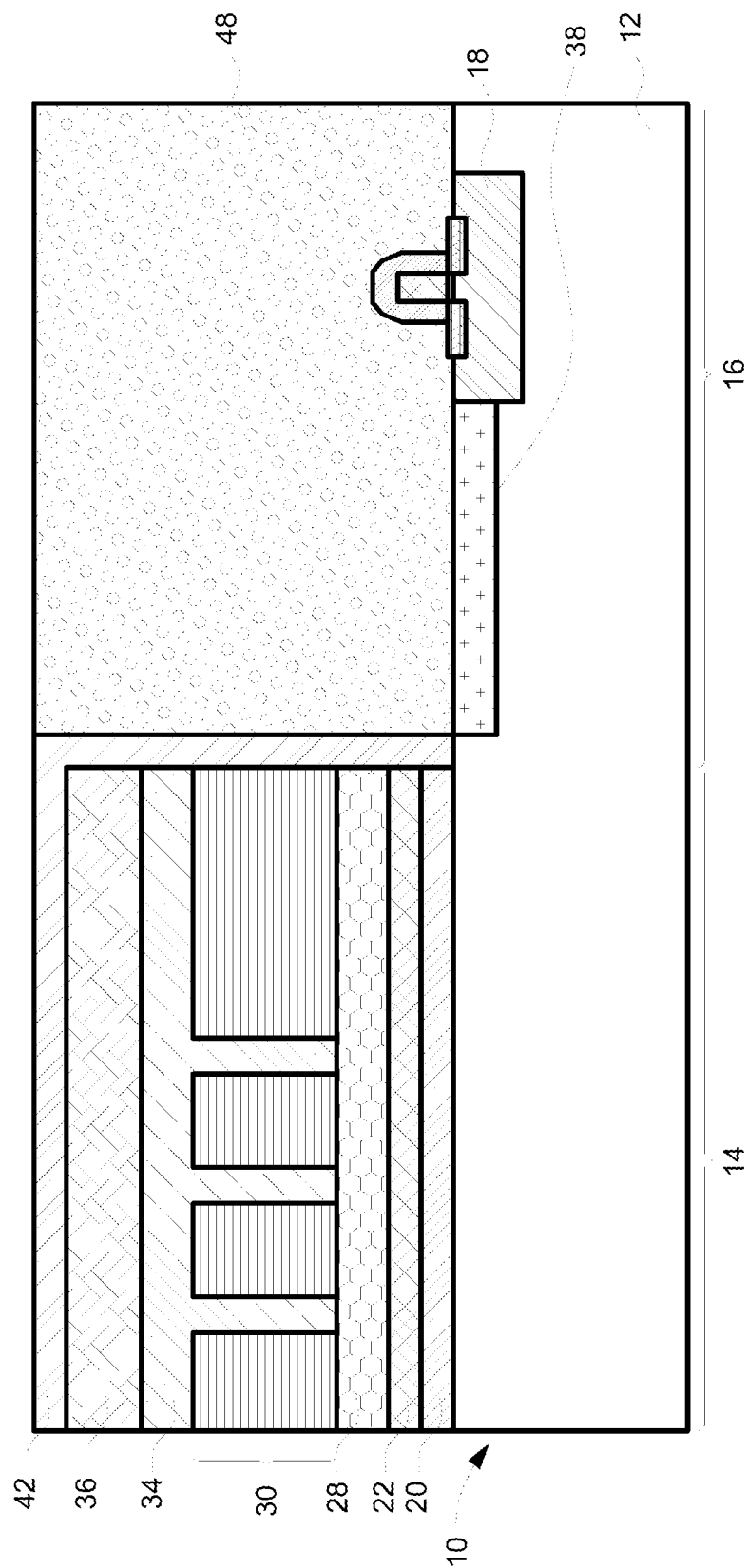
FIG. 12 is a cross-sectional view of an exemplary semiconductor device.

FIG. 12 shows the semiconductor device 10 of FIG. 11 after forming the first interlayer dielectric layer 48. The first interlayer dielectric layer 48 is formed over the semiconductor device 10 particularly in the peripheral region 16. A CMP process is then performed that stops on the polysilicon layer 42.

Figure 13:
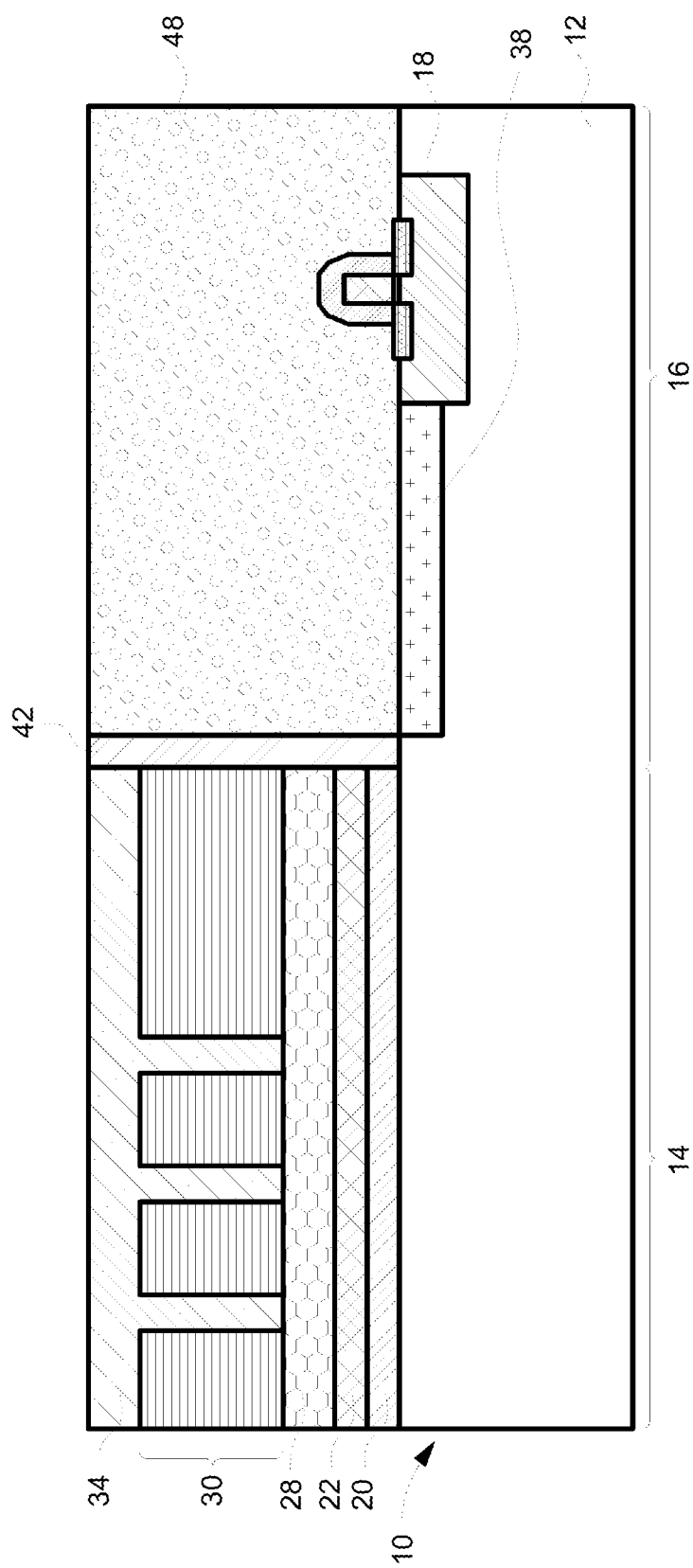
FIG. 13 is a cross-sectional view of an exemplary semiconductor device.

FIG. 13 shows the semiconductor device 10 of FIG. 12 after further CMP processing. The further CMP processing may be a continuation of the same CMP process or a second CMP process and stops on the polysilicon layer 34. In some embodiments, the polysilicon layer 34 and/or the polysilicon layer 42 may be changed to a conductive layer having a lower resistance.

Figure 14:
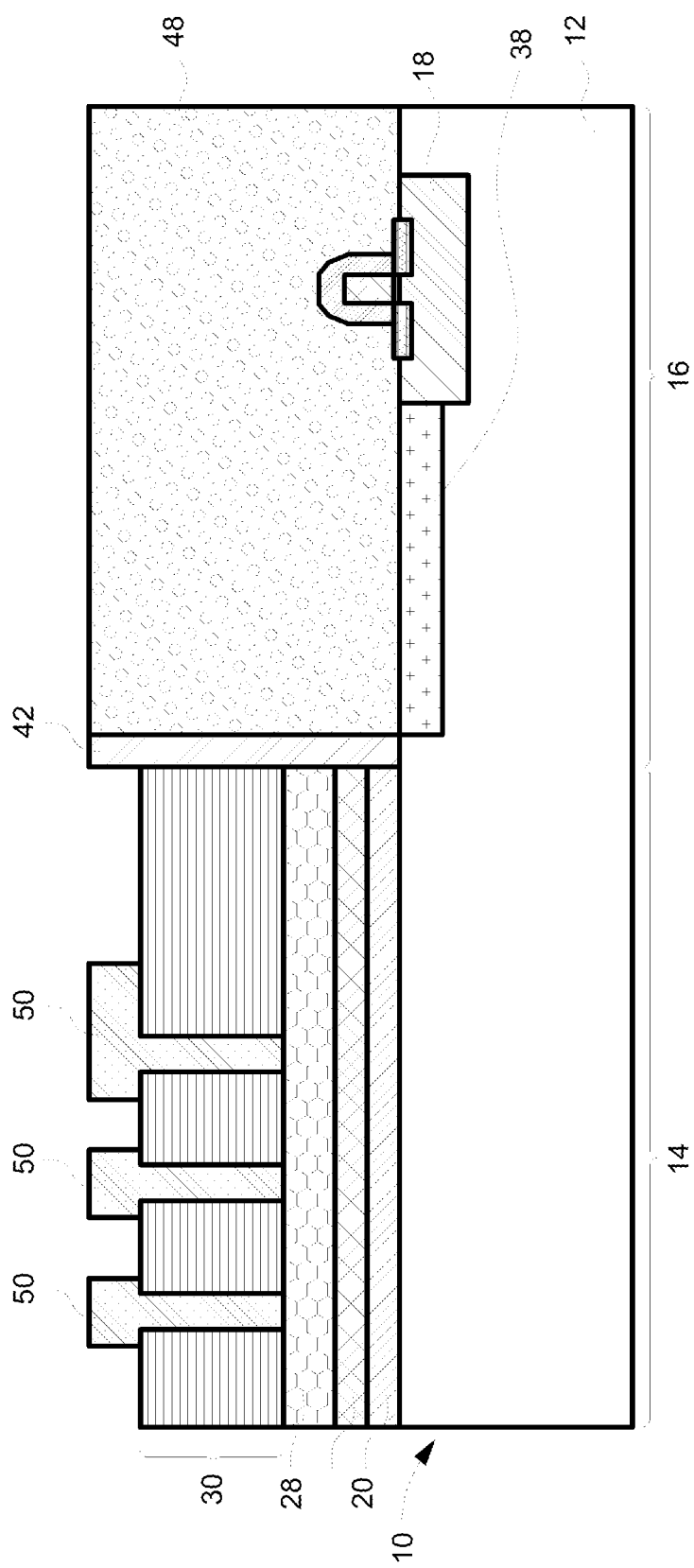
FIG. 14 is a cross-sectional view of an exemplary semiconductor device.

FIG. 14 shows the semiconductor device 10 of FIG. 13 after patterning the polysilicon layer 34 to provide the word line structures 50. In some embodiments, the polysilicon layer 42 and the oxide layer 36 could be reserved and serve as a hard mask for the polysilicon layer 34 during patterning of the polysilicon layer 34.

Figure 15:
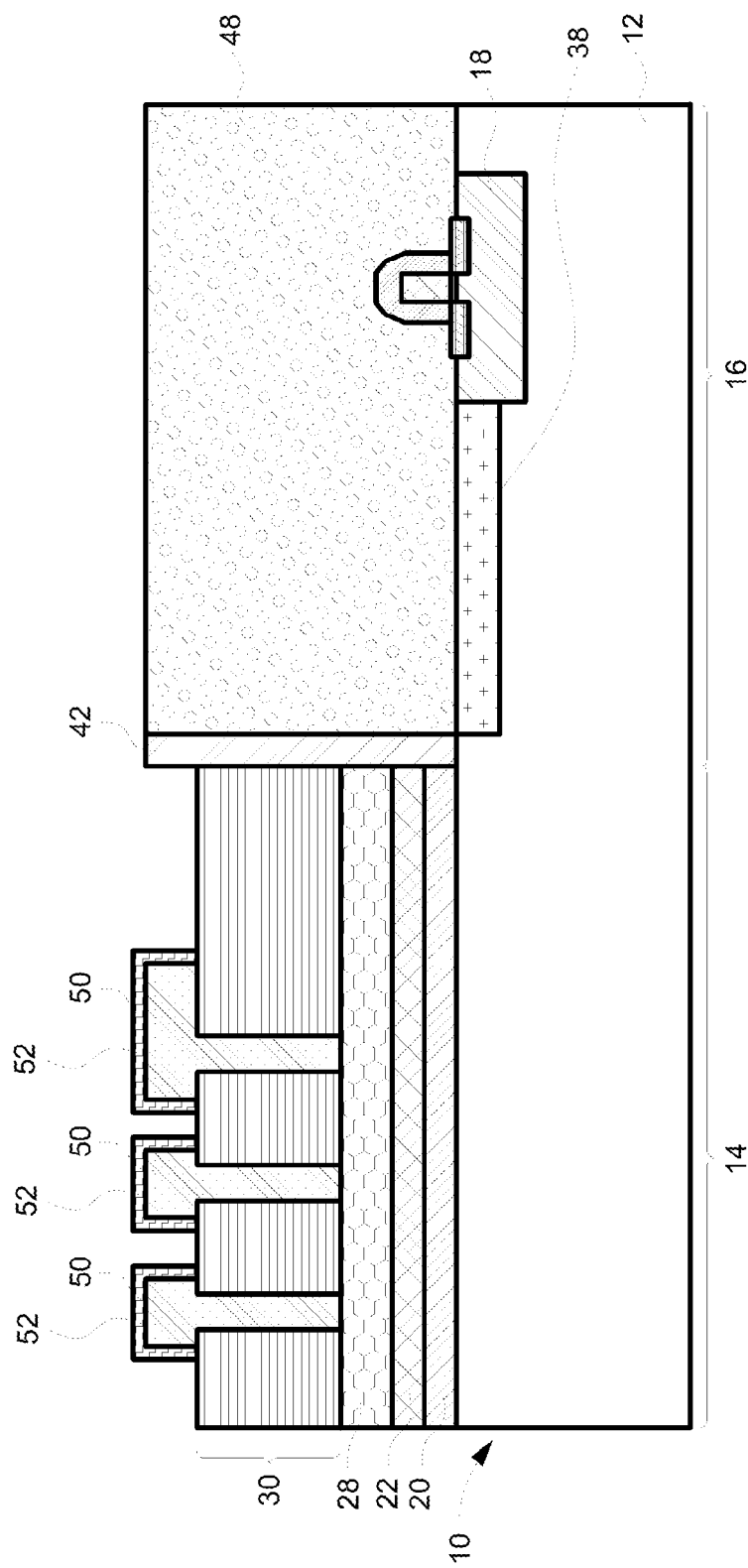
FIG. 15 is a cross-sectional view of an exemplary semiconductor device.

FIG. 15 shows the semiconductor device 10 of FIG. 14 after forming the silicide layers 52 over the word line structures 50. Alternatively, the word line structures 52 may be converted to conductive layers such as a metal layer.

Figure 16:
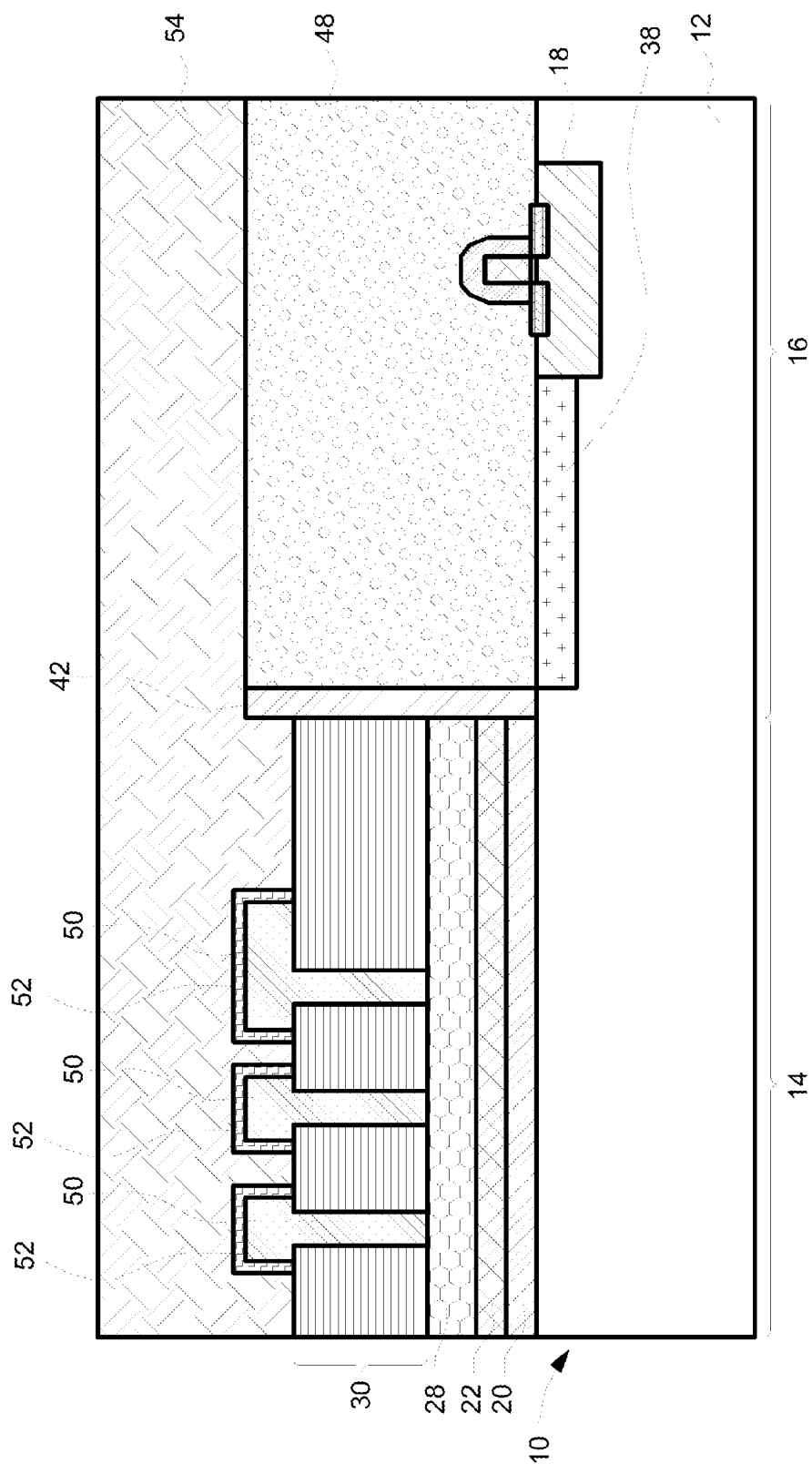
FIG. 16 is a cross-sectional view of an exemplary semiconductor device.

FIG. 16 shows the semiconductor device 10 of FIG. 15 after forming the second interlayer dielectric layer 54. A CMP process may be performed after forming the second interlayer dielectric layer 54 to planarize the semiconductor device 10.

Figure 17:
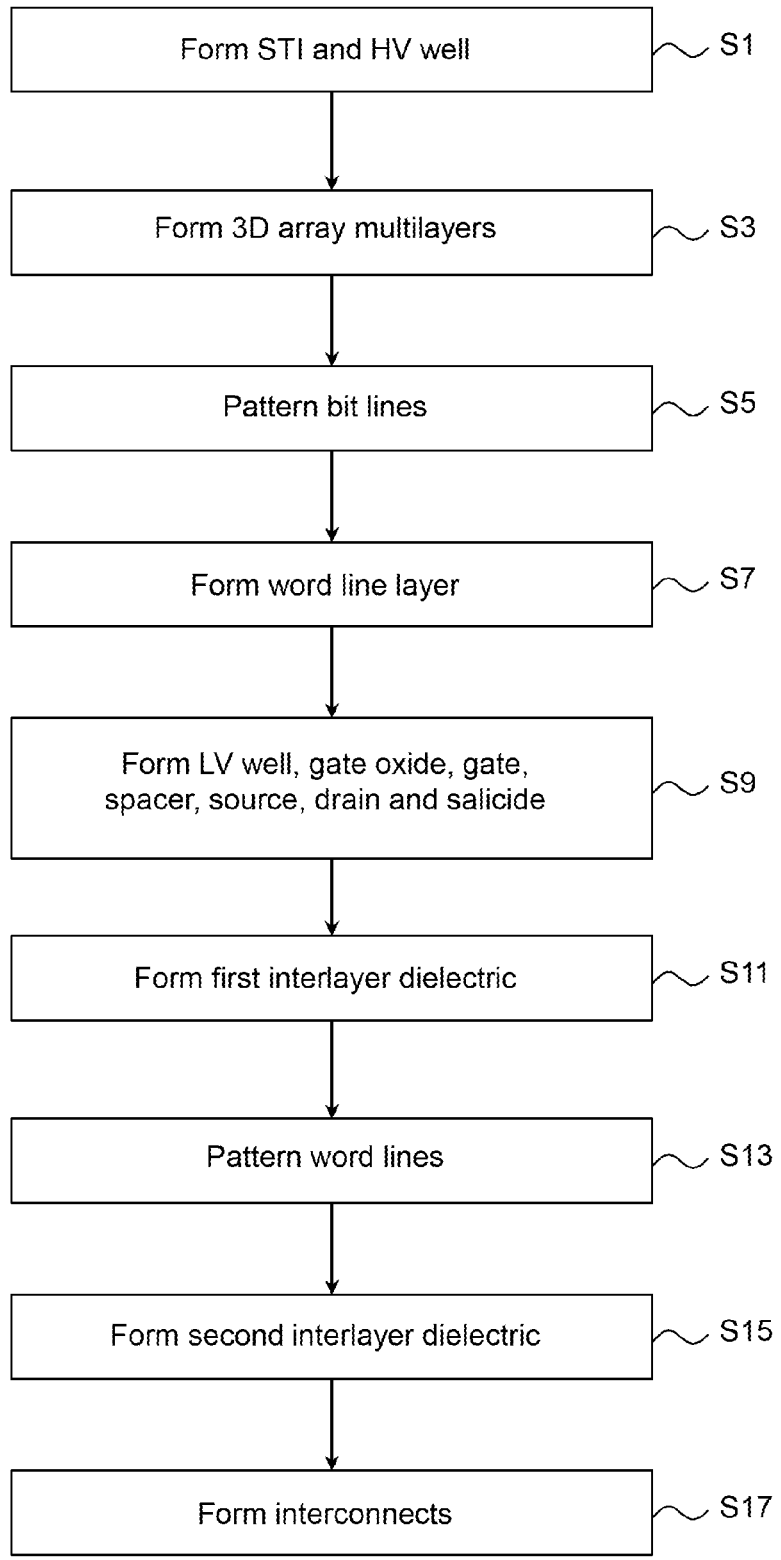
FIG. 17 is a flow diagram of an exemplary process for forming an exemplary semiconductor device.

FIG. 17 shows an exemplary process of forming a semiconductor device such as a 3D memory device. At step S1, STI structures and a HV well are formed in a substrate. At step S3, 3D multilayers, such as a ONO or ONONO memory layer, for a 3D array are formed over the substrate. At step S5, bit lines are deposited and patterned. At step S7, a layer for word lines is deposited. Thus, the 3D memory layers are formed before the word lines are deposited. At step S9, the LV well, gate oxide, gate, spacer, source region, drain region and silicide layers are formed. At step S11, a first interlayer dielectric layer is formed. At step S13, the word line layer is patterned to provide word lines. Also at step S13, the word lines are changed to a conductive layer or silicide may be formed over the word lines. At step S15, a second interlayer dielectric layer is formed. At step S17, conductive layers are formed and patterned to provide interconnects to the semiconductor device.

An exemplary advantage of the above described processes and structures includes formation of peripheral circuitry after the formation of the array to reduce or avoid damage to the peripheral circuitry from exposure to high temperature conditions in the array formation. For example, better performance can be provided by forming CMOS structures after the oxide of ONONO layers. Memory performance can also be improved by permitting the use of higher temperatures in array formation without impacting performance of peripheral structures.

An another exemplary advantage, the array structures may be formed above the substrate instead of in a trench thereby avoiding yield impact from different trench depth caused by reactive ion loading effects. In addition, separating the array from the substrate reduces leakage (e.g., no p-n junction) and provides a larger substrate capacitance.

Exemplary applications of the above described processes and structures include floating gate memory, charge trapping memory, non-volatile memory and embedded memory. It will be appreciated that the processes and structures are also applicable to other types of devices.

While various embodiments in accordance with the disclosed principles have been described above, it should be understood that they have been presented by way of example only, and are not limiting. Thus, the breadth and scope of the invention(s) should not be limited by any of the above-described exemplary embodiments, but should be defined only in accordance with the claims and their equivalents issuing from this disclosure. Furthermore, the above advantages and features are provided in described embodiments, but shall not limit the application of such issued claims to processes and structures accomplishing any or all of the above advantages.

Additionally, the section headings herein are provided for consistency with the suggestions under 37 C.F.R. 1.77 or otherwise to provide organizational cues. These headings shall not limit or characterize the invention(s) set out in any claims that may issue from this disclosure. Specifically and by way of example, a description of a technology in the "Background" is not to be construed as an admission that technology is prior art to any invention(s) in this disclosure. Neither is the "Summary" to be considered as a characterization of the invention(s) set forth in issued claims. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention(s), and their equivalents, that are protected thereby. In all instances, the scope of such claims shall be considered on their own merits in light of this disclosure, but should not be constrained by the headings set forth herein.

What is claimed is:

1. A semiconductor device, comprising:
   a substrate including a memory array region and a periphery region;
   a stack structure of memory layers formed over the substrate in the memory array region;
   a transistor structure having a gate structure formed in the periphery region;
   an underlying layer between and adjacent to both the substrate and a bottom portion of the stack structure in the memory array region, the underlying layer solely comprising one or more non-conducting layers between the substrate and the stack structure in the memory array region; and
   a semiconductor layer formed on a sidewall of the stack structure and disposed in a vertical direction with respect to a major surface of the substrate, wherein
   the underlying layer has a thickness that is approximately equal to a height between the substrate and the bottom portion of the stack structure in the memory array region,
   a bottom portion of the gate structure in the periphery region is disposed at a height from the substrate that is less than the height between the substrate and the bottom portion of the stack structure in the memory array region,
   a first vertical surface of the semiconductor layer contacts an insulating layer formed over the gate structure, and
   a second vertical surface of the semiconductor layer is in contact with each of the memory layers of the stack structure.

2. The semiconductor device of claim 1, wherein a height difference between the bottom portion of the gate structure and the bottom portion of the stack structure is approximately equal to a thickness of a first non-conducting layer of the one or more non-conducting layers in the underlying layer.

3. A semiconductor device, comprising:
   a substrate including a memory array region and a periphery region;
   a stack structure of memory layers formed over the substrate in the memory array region;
   a transistor structure having a gate structure formed in the periphery region; and
   an underlying layer between and adjacent to both the substrate and a bottom portion of the stack structure in the memory array region, the underlying layer solely comprising one or more non-conducting layers between the substrate and the stack structure in the memory array region, wherein
   the underlying layer has a thickness that is approximately equal to a height between the substrate and the bottom portion of the stack structure in the memory array region,
   a bottom portion of the gate structure in the periphery region is disposed at a height from the substrate that is less than the height between the substrate and the bottom portion of the stack structure in the memory array region,
   the underlying layer further comprises:
      a first non-conducting layer adjacent to the bottom portion of the stack structure; and
      a second non-conducting layer between the first non-conducting layer and the substrate in the memory array region, and
   the height difference between the bottom portion of the gate structure and the bottom portion of the stack structure is approximately equal to a thickness of the first non-conducting layer and the second non-conducting layer.

4. The semiconductor device of claim 1, wherein the semiconductor layer is a polysilicon layer.

5. The semiconductor device of claim 1, wherein the stack structure includes an ONO layer.

6. The semiconductor device of claim 2, wherein the first non-conducting layer is a nitride layer.

7. The semiconductor device of claim 3, wherein the second non-conducting layer is an oxide layer.

8. The semiconductor device of claim 1,
   wherein the stack structure in the memory array region comprises alternating polysilicon layers and oxide layers; and
   wherein the bottom portion of the stack structure is defined by a bottom portion of a bottommost polysilicon layer in the stack structure.

* * * * *